US007884679B2

(12) United States Patent
Mahooti

(10) Patent No.: US 7,884,679 B2
(45) Date of Patent: Feb. 8, 2011

(54) PROCESS, VOLTAGE, TEMPERATURE COMPENSATED OSCILLATOR

(75) Inventor: Kevin Mahooti, Sunnyvale, CA (US)

(73) Assignee: NXP B.V., Eindhoven (NL)

( * ) Notice: Subject to any disclaimer, the term of this patent is extended or adjusted under 35 U.S.C. 154(b) by 44 days.

(21) Appl. No.: 12/406,418

(22) Filed: Mar. 18, 2009

(65) Prior Publication Data

US 2010/0237955 A1 Sep. 23, 2010

(51) Int. Cl.
H03K 3/02 (2006.01)
(52) U.S. Cl. ............... 331/143; 331/70; 331/111; 331/176
(58) Field of Classification Search .......... 331/11, 331/16, 44, 66, 74, 111, 176
See application file for complete search history.

(56) References Cited

U.S. PATENT DOCUMENTS

| 6,157,270 | A  | * | 12/2000 | Tso ................. 331/176 |
| 6,191,660 | B1 |   | 2/2001  | Mar et al. |
| 6,356,161 | B1 | * | 3/2002  | Nolan et al. .......... 331/176 |
| 6,515,551 | B1 |   | 2/2003  | Mar et al. |
| 6,642,804 | B2 |   | 11/2003 | Chrissostomidis et al. |
| 6,798,299 | B1 | * | 9/2004  | Mar et al. ............. 331/17 |
| 2002/0121940 | A1 | | 9/2002 | Chrissostomidis et al. |
| 2004/0071029 | A1 | * | 4/2004 | Sutardja ............ 365/211 |
| 2005/0134393 | A1 | | 6/2005 | Kim et al. |
| 2006/0164174 | A1 | * | 7/2006 | Molina et al. ......... 331/16 |
| 2007/0008042 | A1 | | 1/2007 | Lee et al. |
| 2009/0302954 | A1 | * | 12/2009 | Chen et al. ........... 331/66 |

FOREIGN PATENT DOCUMENTS

| DE | 4340924 A1 | 6/1995 |
| DE | 102004061313 A1 | 7/2005 |
| KR | 20070005814 A | 1/2007 |

OTHER PUBLICATIONS

Sundaresan, K. et al. "Process and Temperature Compensation in a 7-MHz CMOS Clock Oscillator" IEEE Journal of Solid-State Circuits, vol. 41, No. 2, Feb. 2006 p. 433-442.
McCorquodale, M. S. et al. A Monolithic and Self-Referenced RF LC Clock Generator Compliant with USB 2.0, IEEE Journal of Solid-State Circuits, vol. 42, No. @, Feb. 2007.
AN2868 Application note STM32F10xxx internal RC oscillator (HSI) calibration, Rev 1. Feb. 2009.

* cited by examiner

*Primary Examiner*—Joseph Chang
*Assistant Examiner*—Jeffrey Shin

(57) ABSTRACT

A voltage reference connects to a voltage-to-current converter to generate a reference current dependent on the reference voltage. Outputs of a toggle-type flip flop connect to switching transistors controlling the reference current charging capacitors. The toggling of the flip-flop is controlled by comparing the capacitor voltages to the reference voltage, such that the toggle frequency is proportional to the time charging the capacitors. Optionally, temperature compensation data, representing a magnitude and direction rotation of the frequency versus temperature characteristic is stored and, based on a sensed temperature, retrieved to modify the reference current.

15 Claims, 13 Drawing Sheets ated oscillator current generator to generate a temperature compensated oscillator current based on the temperature compensation current added to, or subtracted from, the base reference current, wherein the reference current generator selects between added and subtracted based on the rotation control signal, further combined with a frequency compensated oscillator current generator to generate the oscillator reference current based on the temperature compensated oscillator current and the frequency trim value.

PROCESS, VOLTAGE, TEMPERATURE COMPENSATED OSCILLATOR

TECHNICAL FIELD

Embodiments relate generally to electronic clock oscillators.

BACKGROUND

Clocks and similar timing signals are used in the operation of wide range of semiconductor circuits such as, for example, microprocessors and microcontrollers. Such clock and timing signals, collectively referenced herein as "clocks," typically must meet given reliability and accuracy requirements over, for example, a specified range of temperatures and other environmental conditions.

Further, systems and devices in which the clock signals are used typically have specified limitations or given budgets as to size and power. Therefore, it is typically desired that hardware generating the clocks consume minimum power and occupy minimum space/volume.

SUMMARY

The invention and its various embodiments provide, among other features, an accurate, temperature-stable clock that may be fabricated using, for example, conventional CMOS technology, and may be integrated on the same chip with, for example, a microprocessor without requiring special processing steps. Further features and benefits include, for example, reduced power consumption, reduced parts count and a reduced number of interconnections. These and other features of the various embodiments provide improved reliability and lowered cost.

Various exemplary embodiments and aspects are described, and persons of ordinary skill in the art will, based reading on this disclosure, readily identify further variations within the scope of the appended claims, as well as additional applications.

As one illustrative example, one clock generator having an oscillator, comprising a voltage reference unit to generate a reference voltage, an oscillator control current unit to generate an oscillator reference current based, at least in part, on the reference voltage, and a toggling oscillator to generate an oscillating output signal at an oscillating frequency based, at least in part, on the reference voltage and the oscillator reference current.

According to one aspect, the oscillator further includes a temperature sensor to output a temperature signal indicative of a temperature of the oscillator, and a storage unit to store a plurality of given temperature compensation data, retrievable based on the temperature signal. Further, according to one aspect, the oscillator control current unit includes a base reference current generator to generate a base reference current based, at least in part, on the reference voltage, and includes a reference current generator to generate the oscillation reference current based, at least in part, on a retrieved temperature compensation data and on the base reference current.

According to one aspect, the oscillator further includes a storage unit to store a plurality of given temperature compensation data, retrievable based on the temperature signal, and a frequency trim storage to store and output a frequency trim value. Further, according to one aspect, the oscillator control current unit comprises a comparator for comparing the temperature signal to a given optimal rotation temperature, and to generate a rotation control signal based on the comparing, and includes a temperature-based compensation current generator to generate a positive coefficient temperature-based current and a negative coefficient temperature based current, combined with a temperature compensation current generator to generate a temperature compensation current based on selecting one of the positive coefficient temperature-based current and the negative coefficient temperature based current, the selecting based on the rotation control signal, and on weighting the selected one by the retrieved temperature compensation data, combined with a a temperature compens- The above-summarized advances and features of the invention are only examples of those provided by the various exemplary embodiments, and are not intended to be exhaustive or limiting of the possible advantages that may be realized.

These and other advantages of the various exemplary embodiments will be apparent from the description herein, and can be learned from practicing systems and method including one or more of the various exemplary embodiments, both as illustrated and specifically described herein and as modified in view of any variation that becomes apparent to those skilled in the art.

Figure 1:
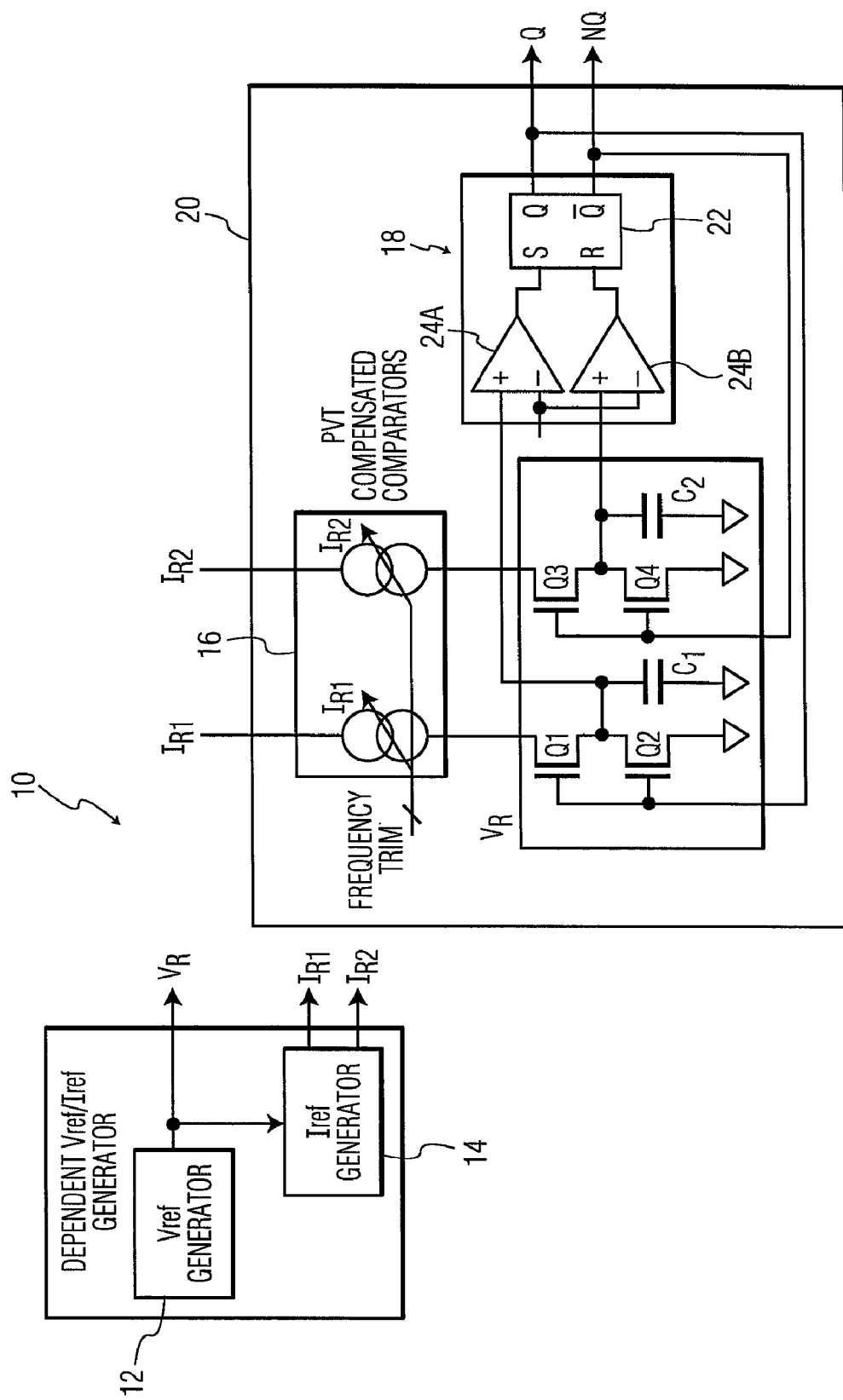
FIG. 1 shows one example functional schematic of one example employing one oscillator according to one example embodiment.

It will be appreciated by persons of ordinary skill in the art that, for clarity of illustration, figures may not be drawn to scale. For example, as will be readily apparent to such persons, graphical depiction of certain proportional relationships of shape, dimension and position among various structural features may be exaggerated with respect to actual physical proportions.

DETAILED DESCRIPTION

Various exemplary embodiments and illustrative examples of each to further assist in practicing the invention are described. To avoid obscuring novel features and aspects, though, and to better provide persons skilled in the relevant arts a complete understanding of the invention, the description may omit various details of methods and techniques that are known to such persons and which, upon reading this description, will be readily identifiable and selectable by such persons in various practices of the claimed inventions.

It will be understood that the particular examples are only for facilitating an understanding of the invention by way of illustrative example. Embodiments of the invention, however, are not limited to the specific examples described. Other configurations and arrangements can, upon reading this description, be readily recognized and implemented by persons skilled in the relevant arts.

Further, various embodiments and aspects may be described separately and/or as having certain differences. Separate description, and/or description of certain differences, however, does not necessarily mean the respective embodiments are mutually exclusive. For example, a particular feature, function, or characteristic described in relation to one embodiment may be included in, or adapted for other embodiments.

The description refers to accompanying drawings, which form a part of this description. For clarity and minimal duplicative description, functional blocks or items that are, or may be, identical or substantially identical between the different drawings, whether of the same or different embodiments, may be identified with like numerals. However, unless otherwise stated or made clear from a particular context, different numerals appearing in different drawings do not mean the respective functions or items cannot be functionally, or structurally identical.

It will be understood that the order in which structures are described is not necessarily representative of an order of fabrication.

One example may include an oscillator having a voltage reference that feeds a voltage-to-current generator. The voltage-to-current generator may generate reference currents that, through switching transistors, charge capacitors. Comparators may compare the voltage of the charging capacitors to the reference voltage and, based on the comparison, clock a toggle-type flip-flop. Outputs of the toggle-type-flop may be fed back to the switching transistors to control the charging and discharging of the capacitors, at a rate approximately inversely proportional to the time span required for the reference current to charge the capacitors to the reference voltage.

The time span may be characterized as a function of the magnitude of the reference current and the magnitude of the reference voltage. According to example embodiments, however, the reference currents are dependent on the reference voltage. Therefore, as will be understood, variations in the reference voltage produce a predictable and generally repeatable corresponding variation in the reference currents.

Example benefits include significantly superior accuracy in frequency, and substantially reduced susceptibility to variation resulting from process variations in the reference voltage, than are obtainable with generating the reference currents independent from the reference voltage.

One second example embodiment includes an oscillator having an oscillating frequency based on a reference voltage and a reference current, with the reference current generation dependent on the reference voltage, thereby providing various features and benefits such as, for example, those described in reference to the first example embodiment. A second example further includes various features of temperature and process compensation, including novel methods and structures, providing additional described functions, features and further benefits.

In one illustrative example a temperature sensor is included and, according to one aspect, an oscillator preliminary reference current is generated based on the reference voltage, and the oscillator reference current is generated based on the preliminary reference current and on the sensed temperature.

According to one aspect, the generation based on the sensed temperature is based, at least in part, on a temperature compensation data obtained from the oscillator at a given stage of fabrication, and then stored to be retrievable and utilized in the generation of the oscillator reference current based, at least in part, on the sensed temperature.

In one illustrative example according to one aspect, an oscillator temperature compensation current is generated based on the retrieved temperature compensation data. The oscillator reference current is, in turn, generated based on, for example, adding the temperature compensation current, or subtracting it from, the preliminary reference current. According to one aspect, control of whether the temperature compensation current is added or subtracted may be based on the sensed temperature relative to a given optimal operating temperature. The optimal operating temperature may, according to one aspect, be a temperature at which an observed coefficient describing the change of an oscillator characteristic such as, for example, oscillator frequency with respect to a change in temperature shows a reversal of sign. A data representing the optimal operating temperature may be stored or fixed in the oscillator.

As will be described in greater detail, according to one aspect, one of the benefits of adding the temperature compensation current to the preliminary reference current at temperatures on one side of (i.e., above or below) the optimal operating temperature, as opposed to subtracting the temperature compensation current at temperatures on the other side of the optimal operating temperature, is a rotation of the temperature versus frequency curve about the optimal operating temperature. As will be further explained and seen, one benefit of this and other aspects' features of rotating the temperature versus frequency curve is a substantially wider temperature band over which the oscillator frequency is within a given specified variation of a nominal frequency.

According to one aspect, the oscillator reference current generated from adding a temperature compensation current to (or subtracting this current from) the preliminary reference current, is combined with a selectable upward or downward adjustment of the temperature compensation current based on a Frequency Trim data, to generate the oscillator reference current.

One Example Of One First Example Embodiment

FIG. 1 shows one example oscillator 10 having an implementation exemplary of one first embodiment. The example oscillator 10 includes a reference voltage generator 12 that generates a reference voltage VR. One example generator 12 is a band gap device. This is only one illustrative example. Alternative technologies and implementations for the generator 12 may be apparent to persons of ordinary skill in the art in view of this disclosure. Implementations of the reference voltage generator 12 may include a temperature compensation structure (not shown) such as, for example, one of the temperature compensation structures that are known to persons of ordinary skill in the art for voltage reference generators used in prior art toggle-type oscillators that employ comparison of a charge voltage to a reference voltage.

As will be apparent to persons of ordinary skill in the arts in view of this disclosure, various specific performance parameters for the generator 12 such as, for example, nominal voltage and temperature coefficients are readily determinable from the particular specifications of the system application and, therefore, further detailed description is omitted.

Referring to FIG. 1, the reference voltage VR from item 12, in turn, is input to a voltage-to-current generator 14 that generates, based on VR, reference currents IR1 and IR2. The reference currents IR1 and IR2, and VR, are input to an oscillator subsection collectively referenced as item 20. As will be described in greater detail, the oscillator subsection 20 generates a toggling, or oscillating output Q and NQ at a frequency substantially proportional to VR, IR1 and IR2 and, according to one aspect, a frequency adjusting control signal Frequency Trim.

Figure 2:
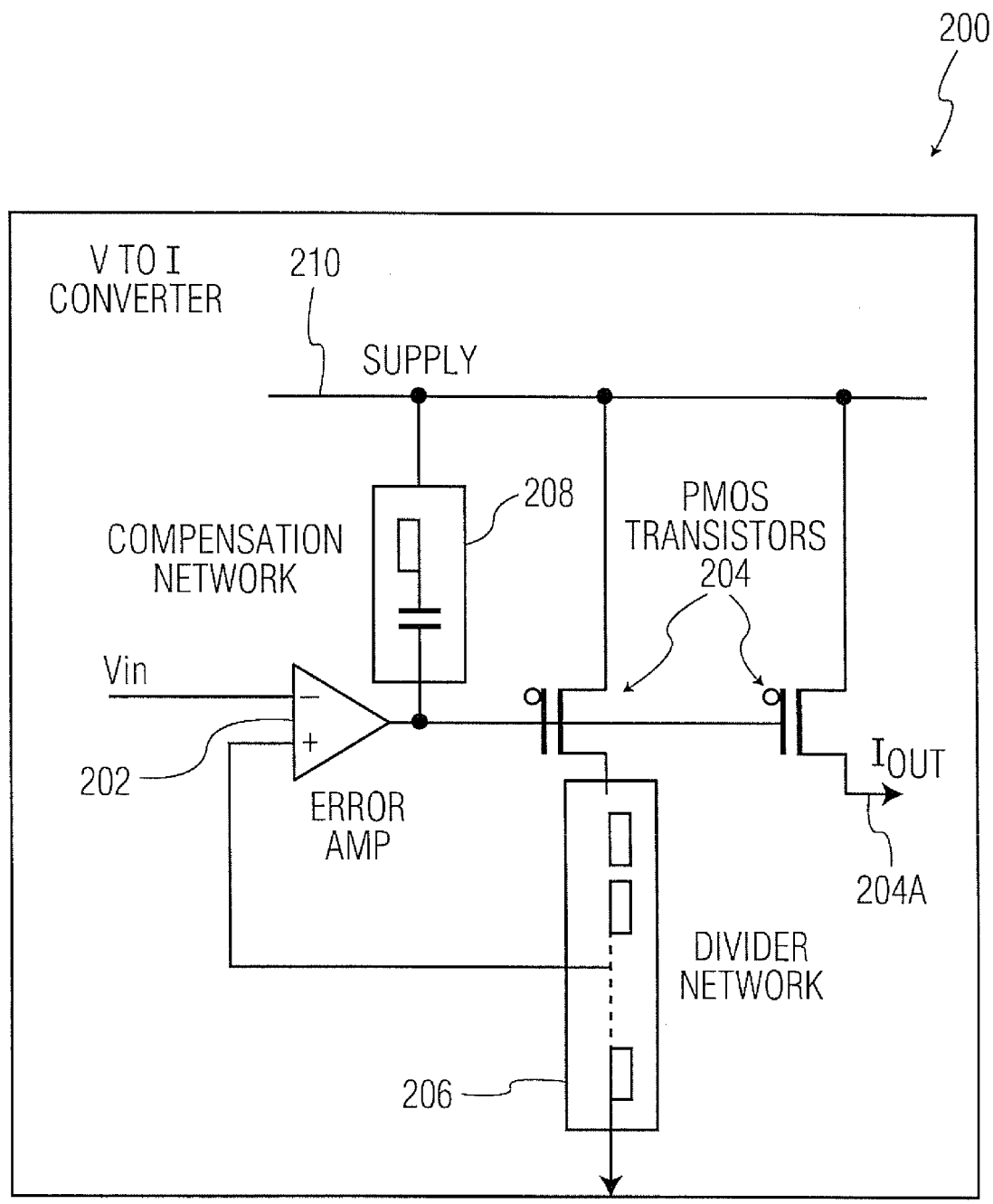
FIG. 2 illustrates one example voltage-to-current implementation for one dependent reference current aspect according to one example embodiment.

FIG. 2 shows a functional schematic of one illustrative example implementation 200 for a voltage-to-current generator 14 generating one of IR1 and IR2 currents by the voltage-to-current generator 14. Referring to FIG. 2, the example includes a difference amplifier 202 receiving at its "−" input the reference voltage VR, with its output feeding the gates of each of a plurality of PMOS transistors 204, and its "+" input receiving a feedback from a voltage divider network 206 driven by the transistors 204. A process, voltage, temperature ("PVT") compensation network 208 connects the output of the compensation network 202 to a supply rail 210. To generate IR1 and IR2, two identical circuits as, for example, depicted at FIG. 2 may be employed, with the outputs 204A from the last stage PMOS transistor of a first such circuit being IR1 and 204A from a second (not shown) being IR2. It will be understood that the FIG. 2 illustration is only an example. Various alternative architectures, topologies, and technologies to implement the voltage-to-current converter 14 may be apparent to persons of ordinary skill in the art upon reading this disclosure.

It will be understood, as stated previously, that except where otherwise stated or otherwise made clear from a particular context, the drawings depicted functions and operations grouped and arranged as blocks only for purposes of facilitating logical description of novel aspects and example operations of the embodiments. The particular depicted arrangements of blocks, though, are not necessarily representative of the arrangements, size/weight/power proportions, or importance of hardware that may be selected by persons of ordinary skill in the art to practice according to the present invention.

With continuing reference to FIG. 1, it may be assumed in reading this description that generator 14 generates IR1 equal to IR2, where "equal" means sufficiently close that effects of differences on oscillator operation and accuracy are negligible with respect to the intended application. With respect to the magnitude of such difference, persons skilled in the art will readily identify means for specifying bounds on the variation of IR1 from IR2 to meet a given performance specification, as well as for fabricating the reference current generator 14 to meet the specified bounds, upon reading this disclosure. Further, the assumption of IR1 being approximately equal IR2 is only for purposes of focusing the description on novel aspects, and is not a limitation. Instead, as will be readily apparent to persons of ordinary skill in art, alternative implementations may be constructed, employing a forming of IR1 unequal from IR2, with other parameters adjusted to sufficiently compensate their difference such that the oscillator performs acceptably.

Referring again to FIG. 1, in the example 10 the outputs IR1 and IR2 from the reference current generator 14 may be, but are not necessarily, input to a frequency adjusting current DAC 16. As will be understood, though, omitting the frequency adjusting DAC 16, or an equivalent, will also omit a frequency adjusting, or trimming feature described in later sections.

Figure 3:
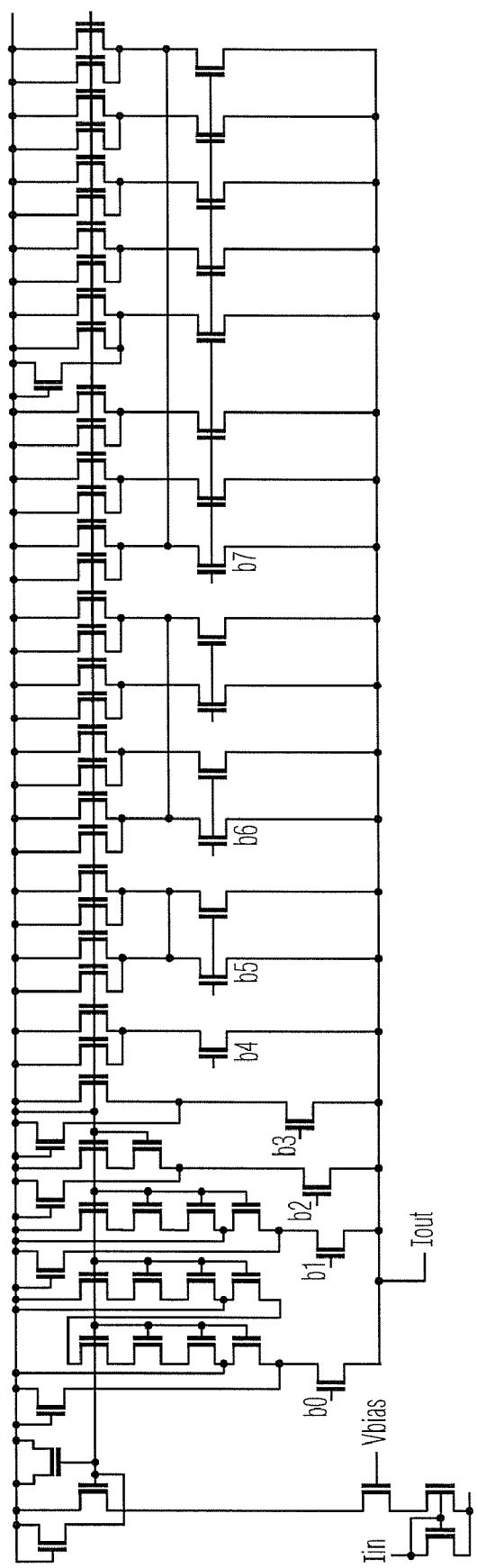
FIG. 3 illustrates one example digital-to-analog current unit for use in various examples having one or more embodiments.
Figure 4A:
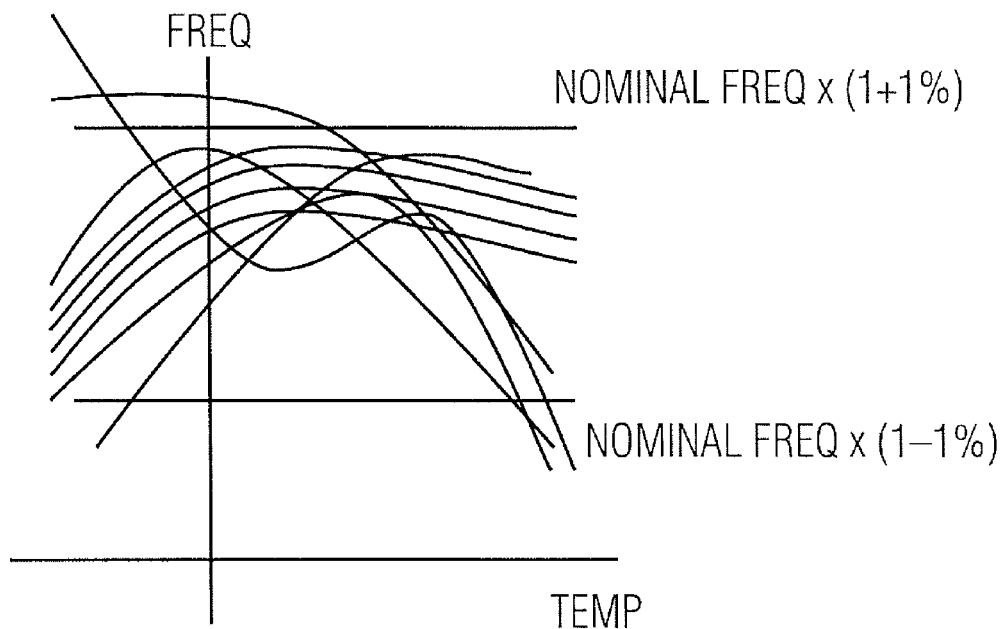
FIG. 4 illustrates, in a representative graphical form, one example benefit of oscillator frequency with respect to temperature characteristics, predicted by one simulation model to be obtainable from aspects of one first example embodiment.
Figure 4B:
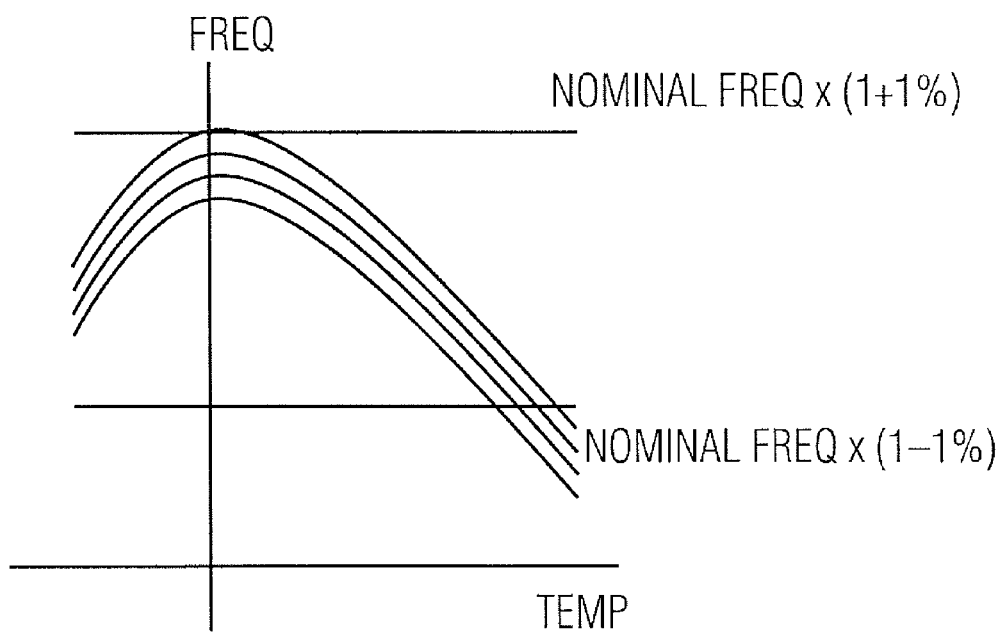
Figure 4C:
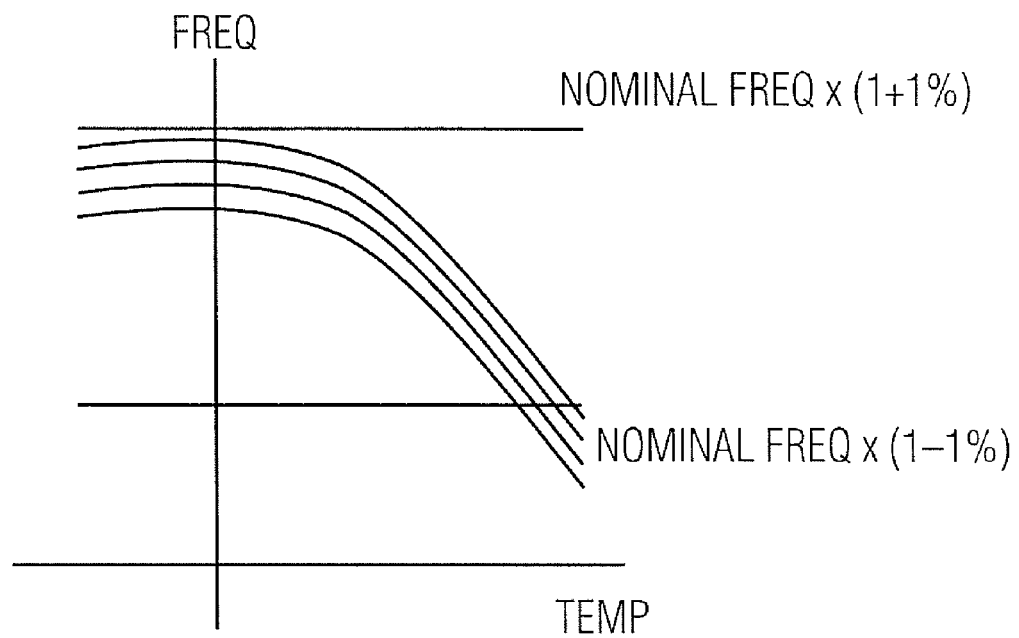
Figure 4D:
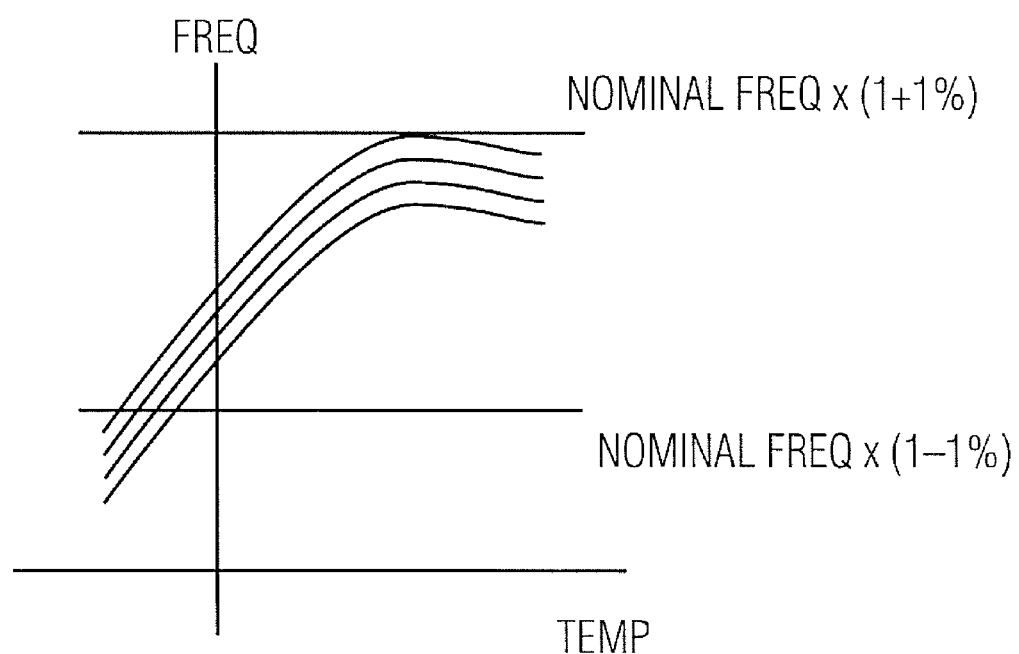

FIG. 3 illustrates one example digital-to-analog current unit to implement the DAC 16. The FIG. 3 example is only illustrative. Persons of ordinary skill in the art may, based on the present disclosure, identify various alternative implementations.

With continuing reference to FIG. 1, the current DAC 16 also receives an N-bit control signal, arbitrarily labeled as Frequency Trim. The value of N dictates the granularity of the frequency trimming and is a design choice, readily identifiable by persons of ordinary skill in the art without undue experimentation, by applying conventional engineering know-how and methodologies combined with this disclosure. Illustrative examples for storage and retrieval of the Frequency Trim data are described later. Since in this example 10 currents IR1 and IR2 are separate, although both generated based on VR and both substantially equal to one another, the current DAC 16 may be implemented as a dual DAC.

Based on IR1 and IR2 and on the Frequency Trim, the current DAC 16 generates what will be termed "frequency trimmed currents," labeled herein as IRF1 and IRF2. Similar to the assumption described above for IR1 and IR2, it will be assumed that, unless otherwise stated, the current DAC 16 generates IRF1 and IRF2 sufficiently equal to one another such that the effects of their differences are negligible.

The resulting currents IRF1 and IRF2, and the reference voltage VR, are input to the clock oscillator subsection 18. As will be understood, once the capacitance of C1 and C2 is fixed, the magnitude of IRF1 and IRF2, together with the magnitude of VR, determine the oscillating frequency of the clock oscillator 18. The Frequency Trim value provides selectable change in IRF1, IRF2 independent of VR, thereby by providing selectable adjustment of the clock 18 oscillating frequency.

As will also be understood, the FIG. 1 embodiment's generating of IR1 and IR2 based on VR provides substantially reduced variance in the nominal or "center" operating frequency that would otherwise result from, for example, fabrication process variances of VR that, without IR1, IR2 being dependent on VR, would not produce corresponding, compensating, variances in IR1 and IR2.

Referring again to FIG. 1, the example clock oscillator 18 comprises an S/R flip flop 22, having a binary Q output controlling a first complementary transistor switch pair Q1 and Q2, and having a binary NQ output controlling a second complementary transistor switch pair Q3 and Q4. Capacitor C1 has a charge "plate," or equivalent conductor, connected to the source-to-drain connection between transistors Q1 and Q2, and a ground "plate" or equivalent connected to a ground potential. Capacitor C2 similarly has a charge plate, or equivalent, connected to the source-to-drain connection of transistors Q3, Q4 and a ground plate connected to the ground potential. The charge plate of capacitor C1 connects to the "+" input of a comparator 24A, and the charge plate of capacitor C2 connects to the "+" input of a comparator 24B. The "−" input of both of the comparators 24A, 24B, receives the VR voltage from the reference voltage generator 12.

It will be understood that the S/R type flip-flop 22 is only one example of the types of toggle-type flip flops that may be used to practice an oscillator as depicted by the FIG. 1 example 10. Alternative types of toggle flip-flops will be apparent to persons of ordinary skill in the art based on this disclosure.

In overview, the mechanism of the "oscillation" of the clock oscillator 18 is that the current IRF1 charges the capacitor C1 until its voltage reaches VR, whereupon the comparator 24A triggers the "S" input of the S/R flip-flop 22, which forces its Q output to a "1" value and its NQ output to a "0" value. These values of Q and NQ control Q1 through Q4 to discharge C1 and feed IRF2 to the capacitor C2. When the capacitor C2 reaches VR the comparator 24B triggers the "R" input of the S/R flip-flop 22, which forces its Q output to a "0" value and its NQ output to a "1" value, and the cycle repeats.

More particularly, operation may be illustrated by selecting an initial condition, at an arbitrary t=0, of C1 and C2 both being discharged to a ground potential, and an arbitrary initial state of the S/R flip-flop 22, at t=0, of Q=logical "1" and NQ=logical "0." In this example, the ground potential will be termed "0" volts, but it will be understood that "0" is not necessarily an absolute value. It will also be understood that the voltages corresponding to logical "0" and logical "1" are a design choice, driven in part, as readily understood by persons of ordinary skill in the art upon reading this disclosure, by the particular circuit architecture and technology selected for implementing the switching transistors Q1, Q2, Q3 and Q4, or an equivalent.

For the particular example arrangement and polarity types of transistors Q1-Q4 in the depicted example 10, the voltage of logical "0" will be below the gate cut-off voltage of Q2 and Q3, and below the gate saturation voltage of Q1 and Q4. Similarly, the voltage corresponding to logical "1" will be above the gate cut-off voltage of Q1 and Q4, and above the gate saturation voltage of Q2 and Q3. Determination of these voltages is readily performed by persons of ordinary skill in the art, based on this disclosure, and, therefore further detail is omitted.

Continuing with the above-identified illustrative example operation, at t=0 capacitors C1 and C2 are at "0" volts or ground potential, the Q output of the S/R flip flop 22 is logical "1" and its NQ output is logical "0." Therefore (according to the example arrangement of polarities of Q1-Q4 in the FIG. 1 example 10), transistor Q1 is ON, Q2 is OFF, Q3 is OFF and Q4 is ON. The IRF1 current therefore passes through Q1 and charges C1, because Q2 is switched OFF, isolating the charging plate of C1 from ground. IRF2, on the other hand, is prevented by the switched-off transistor Q3 from charging C2. Instead, Q4 being ON maintains C2 at approximately zero (i.e., the drain-to-source drop of Q4) volts. At t=t1 the current IRF1 has charged capacitor C1 to a voltage relative to VR such that the comparator 24A outputs a voltage change, or equivalent signal characteristic, sufficient to trigger the "S" input of the S/R flip-flop 22.

To focus description to illustrate novel aspects, it will be assumed that the threshold voltage difference between the "+" and "−" inputs necessary to trigger the comparators is "0" volts. Persons of ordinary skill in the art will understand this is an example ideal threshold, but can readily modify this description of an example operation to match a different threshold difference. Further, the particular signal characteristic of the comparator 24A output will be assumed to be a rising edge having, for example, a given minimum slew rate. As understood by persons of ordinary skill in the art the particular characteristic is determined, in part by the input characteristics of the S/R flip-flop 22.

Continuing with the example illustrative operation of the FIG. 1 example 10, as described above, at t=t1 the capacitor C1, which has been charged since t=t0 by the current IRF1, is at the voltage VR. In response, the comparator 24A outputs, for example, a rising edge to the "S" input of the S/R flip-flop 22. The flip-flop 22, in response, changes state from its above-described initial state to the new state of Q being logical "1" and NQ being logical "0." Referring to FIG. 1, because of the feedback lines from the flip-flop 22 to the switching transistors Q1-Q4, a result is transistor Q1 being switched OFF and Q2 switched on, and Q3 being switched ON and Q4 switched OFF. Therefore, at t=t1, the switched ON of Q2 discharges the capacitor C1 to approximately "0" volts, while the now switched ON Q3 feeds IRF2 to charge the capacitor C2, which is now isolated from ground by the switched OFF state of Q4.

At a next time point, which may be termed t=t2, the capacitor C2 reaches voltage VR. Assuming, as stated previously, IRF1 is substantially equal to IRF2, and assuming the capacitance C1 is equal to C2 (an assuming, for example, comparators 24A and 24B having substantially identical characteristics, and transistors Q1 and Q3 have similar ON resistance), the time for C2 to reach VR relative to time t1 will be approximately the same as t1. Therefore, under these assumptions, t2 is approximately 2×t1.

Therefore, at t=t2, the output of comparator 24B generates a trigger to the "R" input of the S/R flip-flop 22. The S/R flip-flop 22, according to known S/R characteristics, changes states again, back to its original state of Q=logical "0" and NQ=logical "1." This, in turn, places Q1-Q4 into the state described above at t=t0, which is Q1 being ON, Q2 OFF, Q1 OFF, and Q4 ON. The above described cycle of IRF1 charging C1 to VR therefore repeats, starting at t=2×t1, instead of t=0.

It can readily seen that the frequency of the above-described oscillation is inversely proportional to the time required for IRF1 and IRF2 to charge C1 and C2 to VR, i.e., to the trigger thresholds of the comparators 24A and 24B. Further, it is readily seen from FIG. 1 that the higher the currents IRF1 and IRF2 the faster the capacitors C1 and C2 are charged. Therefore it is readily understood that varying the Frequency Trim value input to the frequency adjusting DAC 16 varies IRF1 and IRF2 and, accordingly, varies the oscillating frequency.

Referring to FIG. 1, significant benefits will now be described, which are provided by embodiments having an oscillator, such as example 10, with the reference currents IR1 and IR2 dependent on the voltage VR from the reference 12, as opposed to being not dependent on VR.

One benefit of the FIG. 1 example 10 generating (through, for example, the voltage-to-current generator 14) the currents IR1 and IR2 dependent on VR is that fabrication process dependent variations in VR will, necessarily, produce corresponding variations in IR1 and IR2. Stated differently, process variations in VR will result in correlated process variations in IR1 and IR2. In contrast, Another benefit is that temperature-dependent changes in VR will produce corresponding, correlated, temperature dependent changes in IR1, IR2. Still another benefit is that the direction of the change in oscillating frequency caused by these variations in VR are opposite to the direction of the change in oscillating frequency caused by the corresponding changes in IR1, IR2.

FIG. 4 illustrates, in a representative graphical form, one example benefit of an oscillator frequency versus temperature characteristic, predicted by one simulation model to be obtainable from an oscillator as above-described first example.

Referring to FIG. 4, oscillator frequency versus temperature characteristic "(a)" illustrates various typical characteristic predicted by one simulation model for an oscillator (not shown in the drawings) having IR1, IR2 generated independent of the reference voltage VR. All of the characteristics "(b)", "(c)" and "(d)" are, in sharp contrast, typical characteristic predicted by one simulation model for an oscillator using a Vref/Iref reference current generator such as the example 14, in an arrangement such as depicted at FIG. 1. As readily seen, the predicted oscillator frequency versus temperature characteristics for examples of the first embodiment such as, for example, depicted at FIG. 1, are significantly more stable, with a characteristic parabolic shape, as opposed to the wide and inconsistent variations predicted for independent generation of the reference current.

Referring to FIGS. 1-3, design considerations for constructing an oscillator according to the first embodiment such as, for example 10, the illustrative exemplar depicted at FIG. 1, will be readily apparent to persons of ordinary skill in the art based on the present disclosure. For example, as will be seen by a person of ordinary skill in the art, statistics such as cycle-to-cycle variation in the comparators' threshold voltage may be a design consideration; as such variation may contribute to jitter in the output of the clock generator 18. Such persons, though, upon reading this disclosure can readily select and implement comparators 24A, 24B to have comparison threshold statistics necessary to meet given jitter specifications.

One Example Of One Second Example Embodiment

Figure 5:
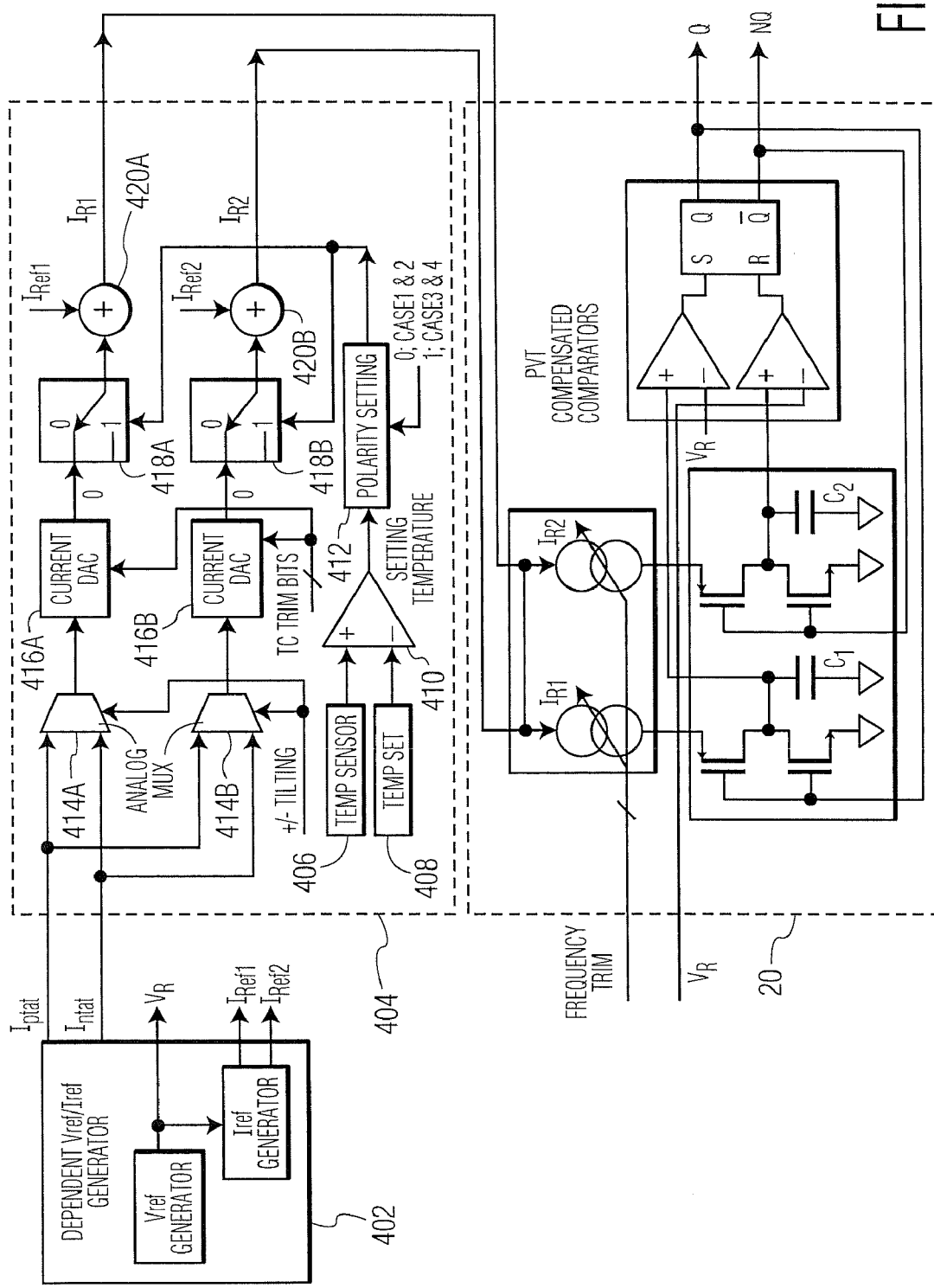
FIG. 5 shows one example functional schematic of one example employing one illustrative example oscillator according to one second example embodiment.

FIG. 5 shows one example oscillator 400 having one example implementation according to a second embodiment. The example oscillator 400 may be implemented, according to one or more aspects, employing certain functions and features that are described above in reference to examples of the first embodiment. Accordingly, like numerals describe like structures or functions, or describe structures or functions that may be substantially similar, throughout the several examples. For example, referring to FIG. 5, the depicted example 400 may include an oscillator subsection 20 substantially like the subsection 20 as described above.

Referring to FIG. 5, the example oscillator 400 includes a temperature-compensated Vref/Iref dependent reference generator 402 that generates a reference voltage VR and, through a voltage-to-current conversion (not shown in FIG. 4), generates currents Iref1 and Iref2 and, further, generates a positive co-efficient current Iptat(temp), and a negative coefficient current Intat(temp). Generation of Iref1 and Iref2 may, for example, be performed using a current-to-voltage converter such as item 14 described above. VR also feeds the "−" terminals of the comparators within the oscillator section 20, also described above.

Figure 6:
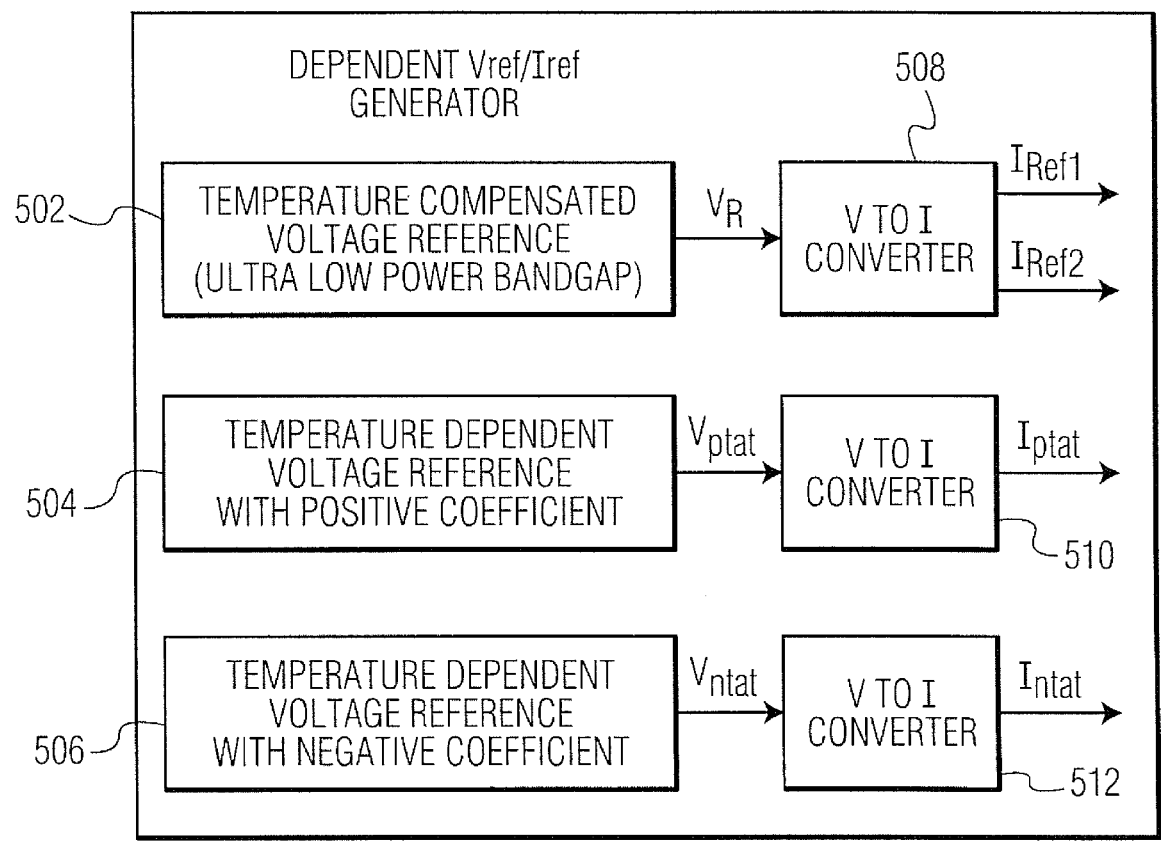
FIG. 6 shows one illustrative example implementation of one example Vref/Iref dependent reference generator from the FIG. 5 example oscillator according to one second embodiment.

FIG. 6 shows one example implementation 500 of the Vref/Iref dependent reference generator 402. Referring to FIG. 6, the depicted example 500 includes a temperature compensated voltage reference 502 generating the reference voltage VR and that may, for example, be implemented as an ultra low power bandgap reference. The temperature compensated voltage reference 502 feeds a voltage-to-current converter 508 that may, for example, be structured as described for item 14 of the FIG. example. The voltage-to-current converter 508 generates Vref/Iref dependent reference currents such as, for example, Iref1 and Iref2 previously described. The example implementation 500 further includes a temperature dependent positive coefficient voltage reference 504, feeding another voltage-to-current converter 508 that may, for example, also be structured as described for item 14. The converter 508 generates Iptat(temp), which functions as described in greater detail in later sections. Similarly, the example implementation 500 further includes a temperature dependent negative coefficient voltage reference 506, feeding voltage-to-current converter 510 that outputs Intat(temp), also described in greater detail in later sections.

Referring to FIG. 5, the currents of Iref1, Iref2, the positive coefficient current Iptat(temp) and negative coefficient current Iptat(temp) are input to a reference current temperature compensation section such as, for example, the illustrated example 404 or equivalent. As described, in greater detail below, in overview, in the example 404 the Iptat(temp) and Intat(temp) currents are each weighted by a retrieved temperature coefficient TC(temp) and, dependent on whether the oscillator 400 is above or below a given optimal operating temperature, are added to or subtracted from Iref1 and Iref2 to generate, respectively, IR1 and IR2. An obtainable result, as described in greater detail in later sections, is a significant, controllable, rotation of the temperature versus frequency characteristic of the oscillator 400. As also described in greater detail in later sections, this rotation further exploits a significant and unique benefit of generating Iref1 and Iref2 based on the reference voltage VR.

More particularly, as described previously in reference to FIG. 4, the present inventor has identified that oscillators according to the earlier-described embodiment appear, as one result of generating Iref1 and Iref2 based on the reference voltage VR, to exhibit a significantly more consistent parabolic form in their operating frequency versus frequency characteristic. As will be understood by persons of ordinary skill in the art, based on reading this disclosure, aspects of the present embodiment additionally exploit one or more capabilities of rotation that are provided by this more stable, generally parabolic form in operating frequency versus frequency characteristics.

Referring again to FIG. 5, in the depicted example 400 the reference current temperature compensation section 404 includes a temperature sensor 406 and a temperature set register 408, respectively connecting to the "+" and "−" inputs of a comparator 410. The temperature set register stores a value, termed TempSet, that is determined by testing, for example, representative samples from the same processing batch as the subject device 400 to obtain a statistical average characteristic of the oscillating frequency with respect to temperature and, from that statistical average characteristic, determine an optimum temperature for rotating the characteristic. The TempSet value preferably represents, or is based at least in part on, that optimal temperature. Examples of determining the TempSet, and illustrative example operations of the reference current temperature compensation section 404 performing example rotations, are described in greater detail in later sections.

With continuing reference to FIG. 5, and more particularly to the reference current temperature compensation section 404, the output of the comparator 410 is input to a polarity setting block 412, and to a pair of analog multiplexers 414A and 414B. The analog multiplexers 414A and 414B are controlled to select one of the Iptat(temp) and Intat(temp) currents and each feed that current to its respective one of the temperature compensation DACs 416A, 416B.

As previously described, Iptat(temp) is a current representing a positive coefficient voltage reference such as, for example, the current output of the FIG. 6 voltage-to-current converter 510 representing the temperature state of the positive coefficient voltage reference 504. Likewise, Intat(temp) is a current representing a negative coefficient voltage reference such as, for example, the current output of the FIG. 6 voltage-to-current converter 512 representing the temperature state of the negative coefficient voltage reference 506. As described in greater detail in later sections, the Intat(temp) current is selected to perform a clockwise, or positive, rotation of the oscillator 400 frequency-versus-temperature characteristic, while Iptat(temp) current is selected to perform what may be represented as a counter-clockwise or negative rotation of the characteristic.

Referring still to FIG. 5, the DACs 416A and 416B perform a weighting of the selected Iptat(temp) and Intat(temp) current, based on temperature trim bits TC. Each of the DACs 416A and 416B may be, for example, according to the example depicted at FIG. 3, or an equivalent thereto.

Regarding the function of TC, as described in greater detail in later sections, the value of the TC data determines the magnitude of the rotation. More particularly, a higher TC means a higher scaling of the Iptat(temp) or Intat(temp) current. A higher (or lower) scaling of the Iptat(temp) or Intat(temp) currents produces, through the controllable inverters 418A, 418B, and the summers 420A, 420B, a higher (or lower) value IR1 and IR2 fed to the oscillator section 20. The value of TC may be based on, or may be calculated or otherwise determined, at a fabrication of the oscillator 400. Illustrative example determinations of TC will be described in greater detail in later sections. As for storing and retrieving TC, referring to FIG. 5 the TC value may, for example, be retrieved from a storage located, for example, apart from the oscillator 400. For example, as will be understood by a person or ordinary skill in the art, implementations having or according to the disclosed embodiments may include an oscillator within, for example, a microcontroller (not shown), and such a person, applying conventional design practices in view of this disclosure, can readily identify and implement a storage for TC.

The number of bits representing TC is a design choice, readily identified, without undue experimentation, by a person of ordinary skill in the art, by applying conventional engineering practices upon reading this disclosure. As one illustrative example, TC may be represented by, for example, approximately five bits.

Referring to FIG. 5, the output of the DACs 416A, 416B is one of Iptat(temp) and Intat(temp), weighted by TC. These outputs may be represented as one of Iptat(temp)×TC or Intat(temp)×TC. It will be assumed that the output of DAC 416A is substantially identical to the output of DAC 416B, for substantially the same reason as previously described for assuming IR1 substantially equal to IR2. These TC-weighted currents output by the DACs are input to the controllable current inverters 418A and 418B which invert, or do not invert, the currents depending on the temperature of the oscillator 400 relative to the Temp Set temperature, (indicated in this example by the output of the comparator 410), and depending on the Polarity Set control to the polarity setting unit 412.

Still referring to FIG. 5, the output of controllable inverter 418A is fed to the analog summer 420A where, in accordance with the sign of the inverter 410A, the weighted compensation current (which is one of Iptat(temp)×TC or Intat(temp)×TC) is added to, or subtracted from, Iref1 to generate IR1. Likewise, the output of controllable inverter 418B is fed to the analog summer 420B where, also in accordance with the sign of the inverter 410B (which is the same as the sign of 410A), the weighted compensation current (which is one of Iptat(temp)×TC or Intat(temp)×TC) is added to, or subtracted from, Iref2 to generate IR2. The currents IR1 and IR2 are then input to the oscillator section 20 which, as further adjusted by the Frequency Trim data (if used), oscillates accordingly.

Figure 7:
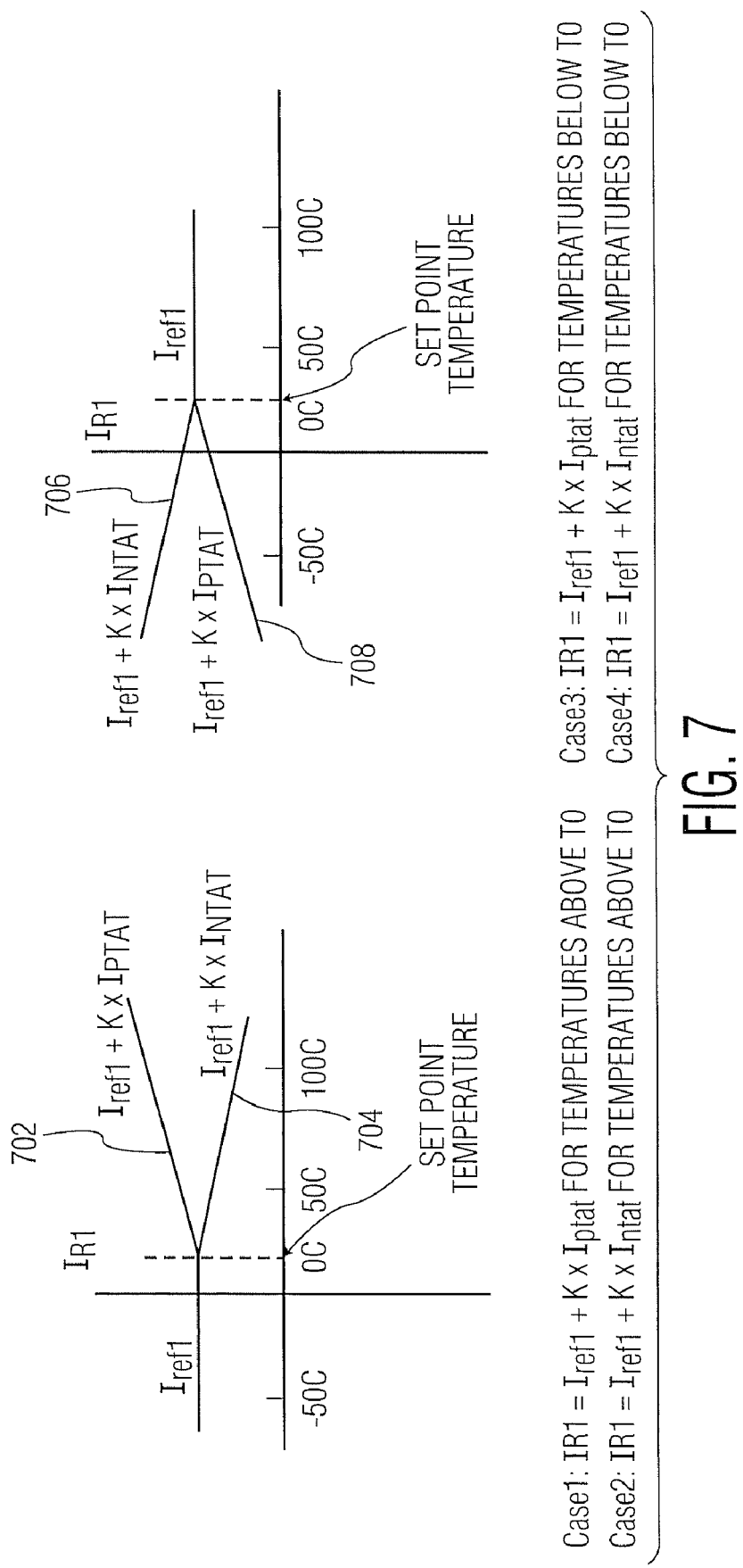
FIG. 7 illustrates, in a representative graphical form, one example showing four exemplar temperature compensation cases capable of being performed by one aspect of one second example embodiment.

FIG. 7 illustrates, in a representative graphical form, one example showing, for four exemplar temperature compensation cases, the generation of IR1 from the temperature compensation section 404 of the FIG. 5 example 400 of one second example embodiment. For each of the cases it will be assumed that IR2 is generated identically. The FIG. 7 scalar multiplier "K" represents the temperature trim value "TC" represented in FIG. 7 as "K."

Referring to FIG. 7, line 702 represents what will be referenced as "Case 1," which is the current IR1 for an oscillator such as 400 that is determined at time of fabrication to require, at temperatures above its determined set point temperature, a positive coefficient current compensation in order to maintain the oscillating frequency within acceptable limits over the given temperature range. The range may for example, extend from the set point temperature to 100 degrees C. Referring to FIG. 5, to produce the current IR1 according to the Case 1 characteristic line 702, analog muxes 414A, 414B are controlled to select Iptat(temp), the TC value determined at time of fabrication is retrieved and input to the DACs 416A, 416B, and the polarity setting unit 412 controls the controllable inverters 418A, 418B such that the summers 420A, 420B, generate IR1=Iref1+(TC×Iptat(temp)).

Referring to FIG. 7, line 704 represents what will be referenced as "Case 2." Line 704 shows the current IR1 for an oscillator such as 400 that is determined at time of fabrication to require, at temperatures above its determined set point temperature, a negative coefficient current compensation to maintain the oscillating frequency within acceptable limits over the given temperature range. Referring to FIG. 5, to produce the current IR1 according to the Case 2 characteristic line 704, analog muxes 414A, 414B are controlled to select Iptat(temp), the TC value determined at time of fabrication (which is likely different from the TC determined for Case 1), is generated and input to the DACs 416A, 416B, and the polarity setting unit 412 controls the controllable inverters 418A, 418B to invert the current such that the summers 420A, 420B, generate IR1=Iref1−(TC×Intat(temp)).

Referring again to FIG. 7, line 706 represents what will be referenced as "Case 3." Line 706 is the current IR1 for an oscillator such as 400 that is determined at time of fabrication to require, at temperatures below its determined set point temperature, a negative coefficient current compensation to maintain the oscillating frequency within acceptable limits over the given temperature range, down to, for example, minus 50 degrees C. Referring to FIG. 5, to produce the current IR1 according to the Case 3 characteristic line 706, analog muxes 414A, 414B are controlled to select Intat (temp), the TC value determined at time of fabrication, which is input to the DACs 416A, 416B, and the polarity setting unit 412 controls the controllable inverters 418A, 418B to not invert the current. The summers 420A, 420B therefore generate IR1=Iref1+(TC×Intat(temp)).

Lastly, referring still to FIG. 7, line 708 represents what will be referenced as "Case 4," which is the current IR1 for an oscillator such as 400 that is determined at time of fabrication to require, at temperatures below its determined set point temperature, a positive coefficient current compensation to maintain the oscillating frequency within acceptable limits over the given temperature range. Referring to FIG. 5, to produce the current IR1 according to the Case 4 characteristic line 704, analog muxes 414A, 414B are controlled to select Iptat(temp), the TC value determined at time of fabrication, input this to the DACs 416A, 416B, and the polarity setting unit 412 controls the controllable inverters 418A, 418B to invert the current. The summers 420A, 420B therefore generate IR1=Iref1−(TC×Iptat(temp)).

Figure 8:
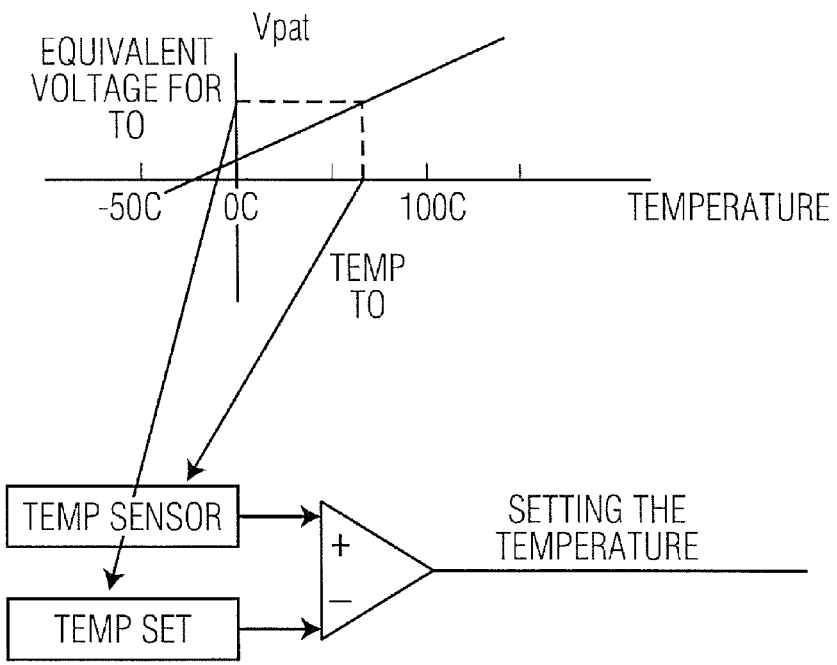
FIG. 8 illustrates, in a representative graphical form, one example of setting the temperature set point of one aspect of one second example embodiment, and for comparing the temperature against the set point.

FIG. 8 illustrates, in a representative graphical form, one example of setting the temperature set point of one aspect of one second example embodiment, and for comparing the temperature against the set point.

Referring to FIG. 8, at time of fabrication the voltage output from, for example, the positive coefficient voltage reference 504 of the FIG. 6 example Vref/Iref dependent reference source is measured (for example in samples from the same processing batch as the subject oscillator 400) and a trimmable voltage source, or equivalent, 408 is configured to input that voltage to the "−" input of the comparator 410. The output of the same structure that, in the sample(s), was measured to determine the set point temperature fixed in 408 is connected to the "+" input of the comparator 410.

Figure 9:
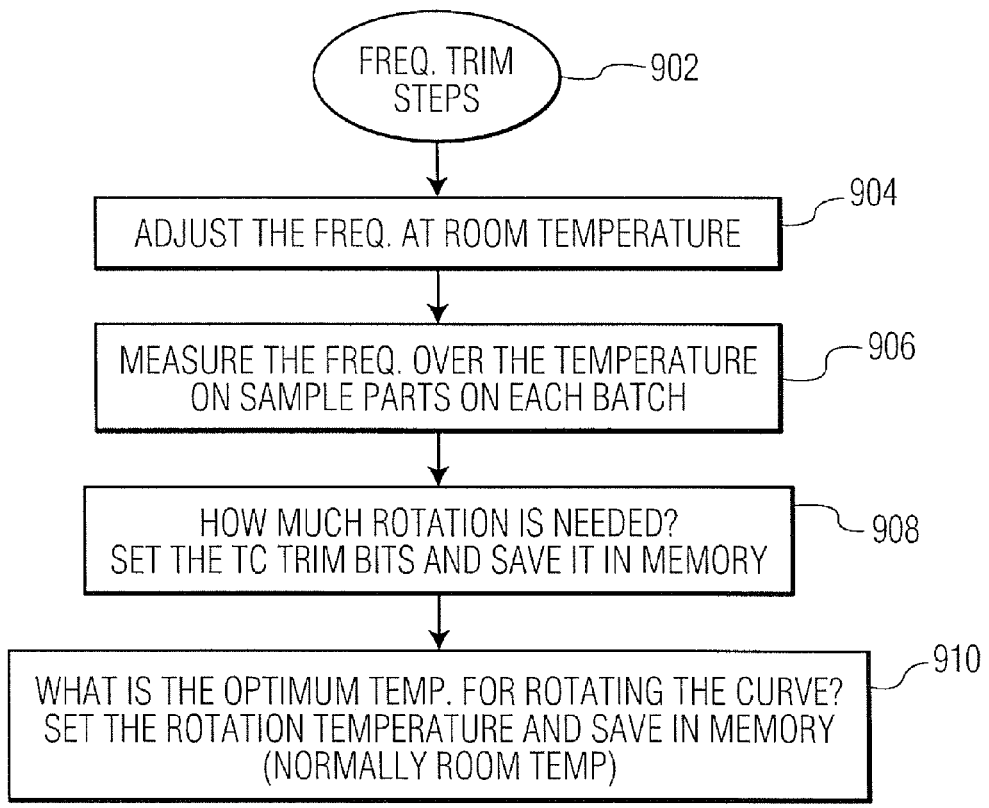
FIG. 9 is graphical diagram of one example operation to determine coefficients and parameters for a rotation according to one example temperature compensation of one aspect of one second embodiment.
Figure 10A:
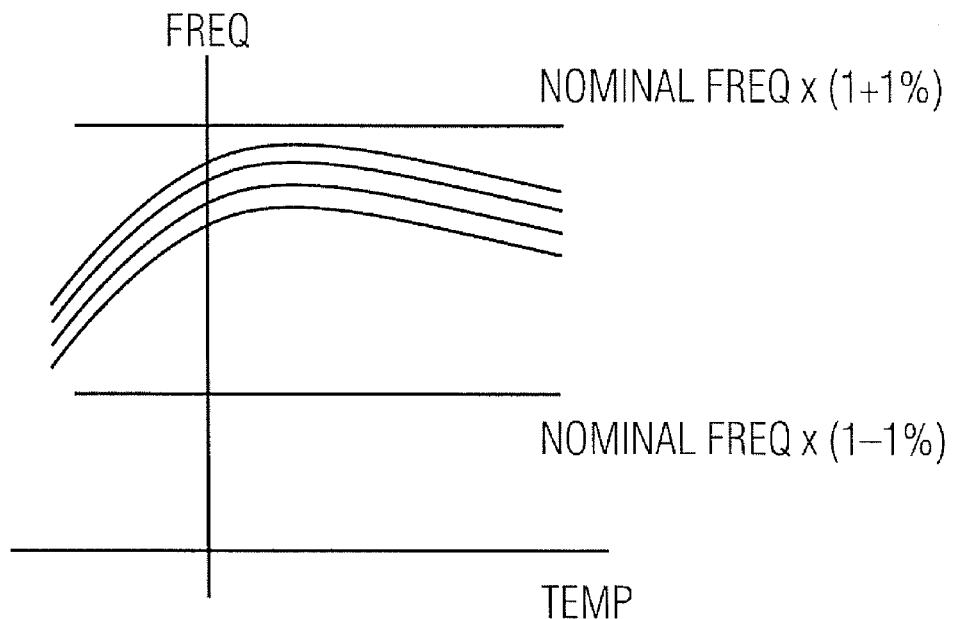
FIG. 10 illustrates, in a graphical representative form, four examples of frequency versus temperature characteristics that may, as predicted by one simulation model of an oscillator according to FIG. 5.
Figure 10B:
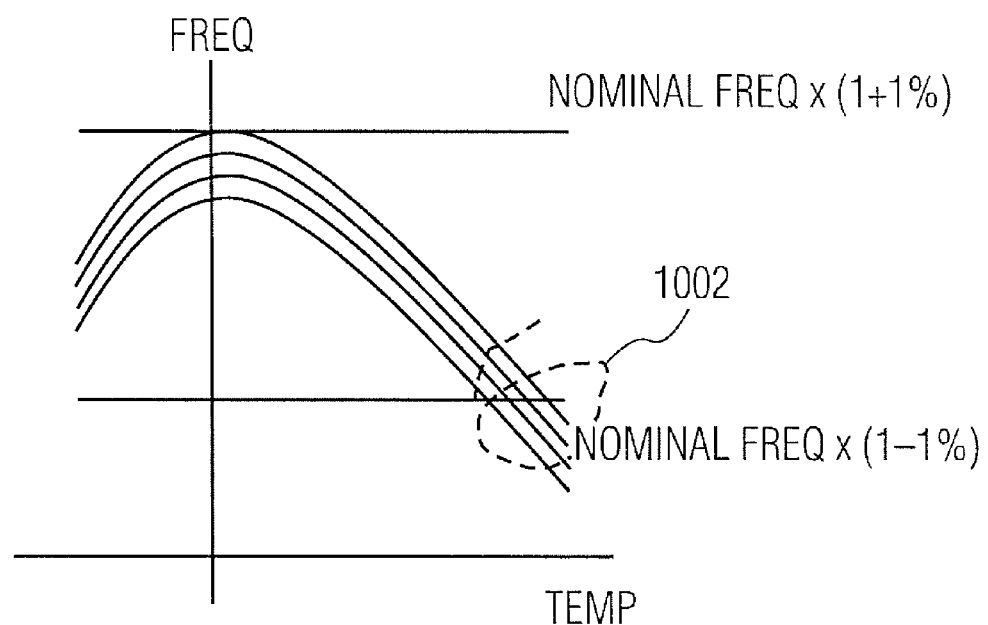
Figure 10C:
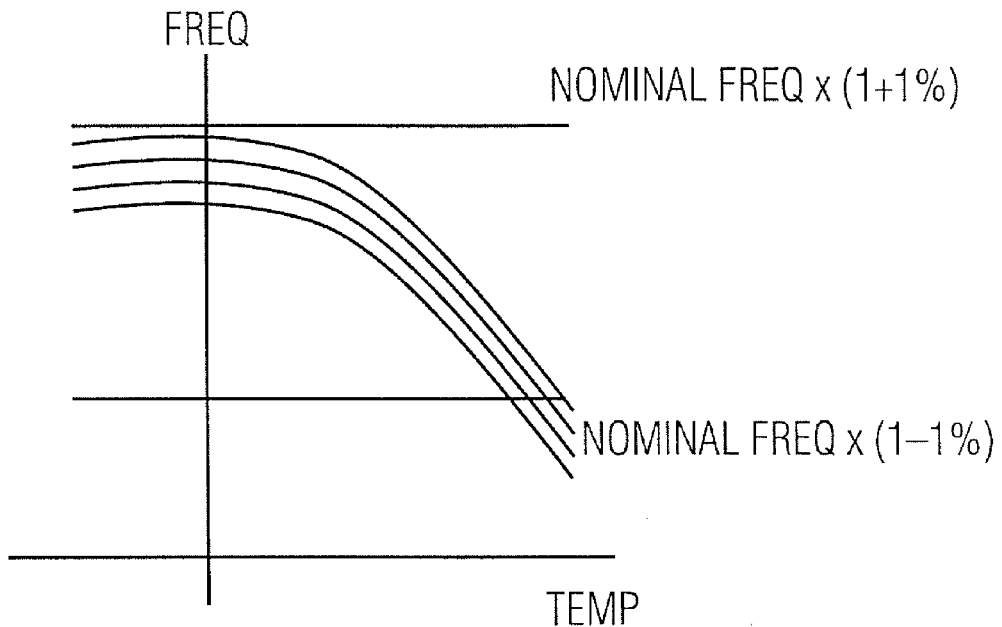
Figure 10D:
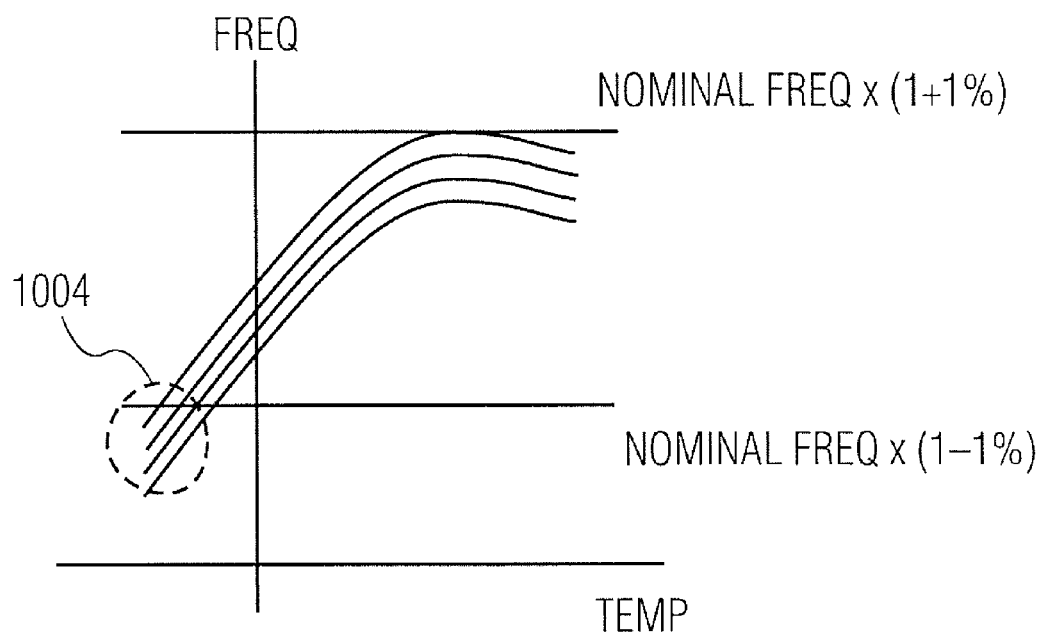
Figure 11A:
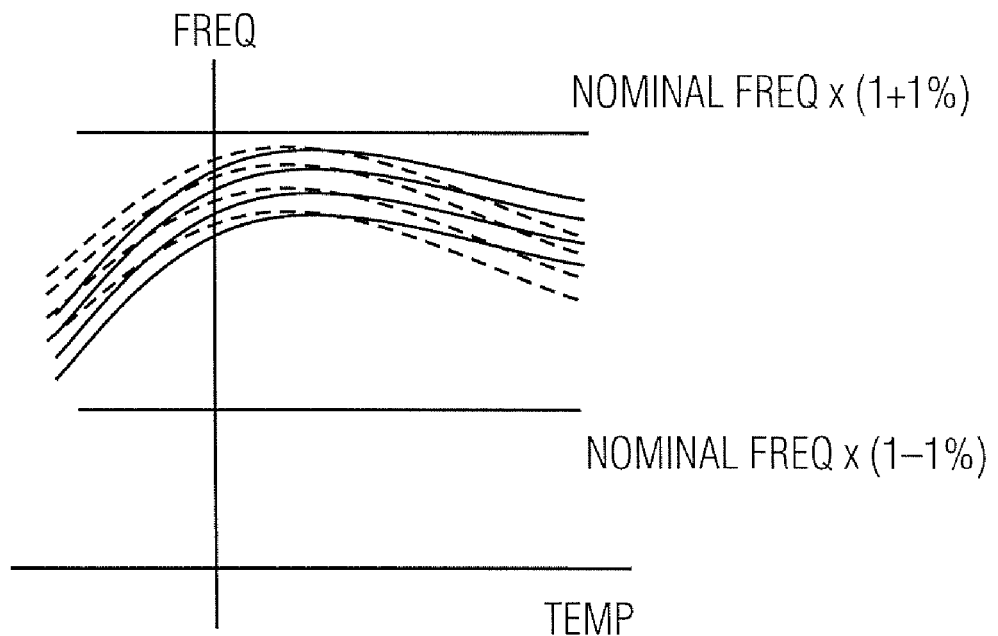
FIG. 11 illustrates, in a representative graphical form, example kinds of benefits of oscillator frequency with respect to temperature characteristics, predicted by one simulation model to be obtainable from aspects of one example according to one second embodiment.
Figure 11B:
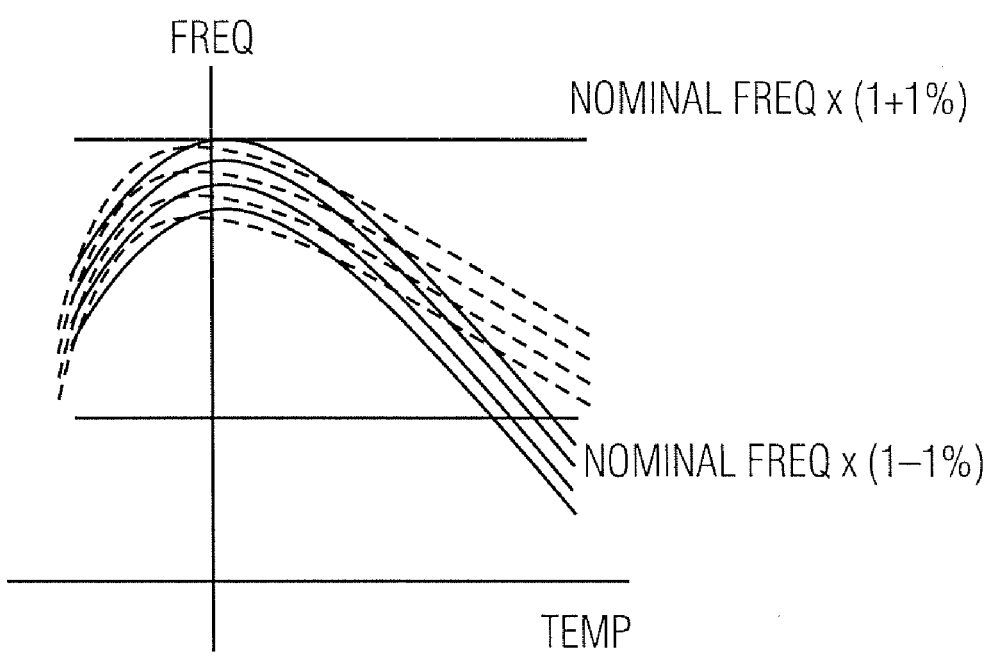
Figure 11C:
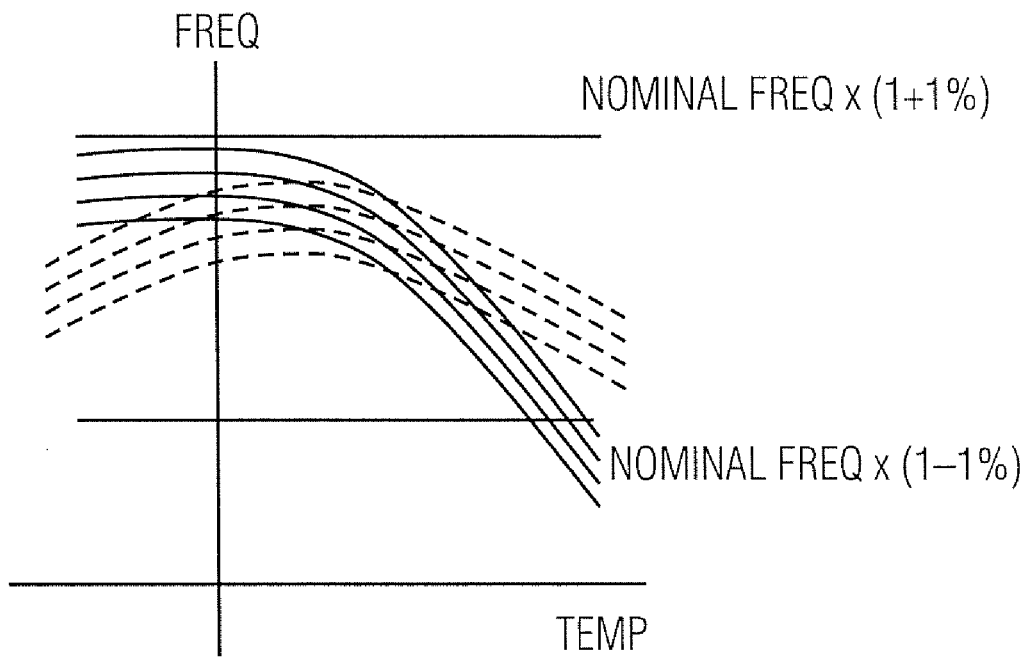
Figure 11D:
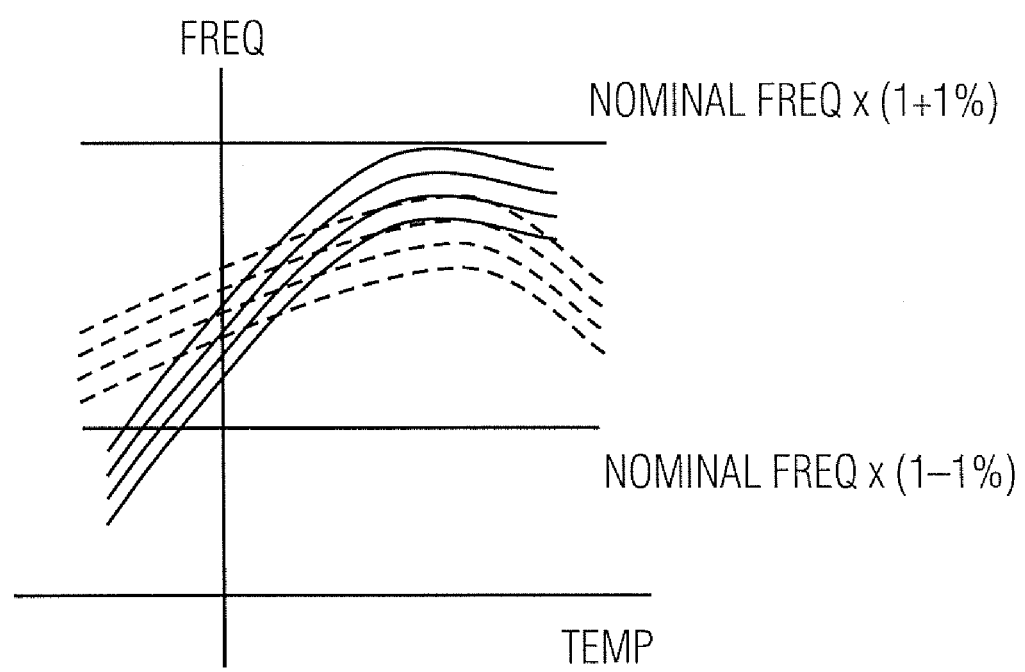

FIG. 9 is graphical diagram of one example operation to determine coefficients and parameters for a rotation according to one example temperature compensation of one aspect of one second embodiment.

Referring to FIG. 9, at 902 and 904 the frequency is adjusted at a given temperature such as, for example, room temperature. The given temperature may be in accordance with a typical ambient temperature of the devices intended environment. The adjustment may be trimming of various circuitry components implementing an oscillator according to FIG. 5, in accordance with conventional engineering practices for trimming, for example, voltage references, voltage-to-current converters, capacitors and resistors, readily identifiable, without undue experimentation, by persons of ordinary skill in the art in view of the present disclosure. At 906 a given quantity of samples of a given processing batch are selected and, for each, frequency versus temperature measurements are collected over a given temperature range. The quantity of samples is readily determinable by persons of ordinary skill in the art, based on conventional process sampling methodologies combined with the present disclosure. At 908 the data is analyzed to determine the amount and direction(s) of rotation necessary to maintain the frequency within a given accuracy over a given temperature range. For illustrative example, a given nominal frequency may be 4 MHz, a given temperature range may be minus 50 degrees C. to plus 100 degrees C., and a given variation may be +/− one percent.

FIG. 10 illustrates, in a graphical representative form, four examples of frequency versus temperature characteristics that may, as predicted by one simulation model of an oscillator according to FIG. 5, be identified at step 908 of the FIG. 9 illustrative example operation for determining TC. The FIG. 10 example frequency tolerance is +/− one percent, and the example temperature range is minus 50 degrees C. to plus 150 degrees C.

Referring to FIG. 10, example characteristic labeled "(a)" shows an acceptable frequency versus temperature characteristic, because and, therefore, TC may be set to "zero." However, if some rotation is desired, step 908 may calculate a TC value that rotates the characteristic in, for example, a clockwise direction. Referring still to FIG. 10, frequency versus temperature characteristics "(b)" and "(c)" show the frequency falling below the minimum acceptable before reaching plus 150 degrees C., and example characteristic "(d)" shows the frequency falling below the minimum acceptable at temperatures above the lower required operating temperature of minus 50 degrees C. Therefore, for FIG. 10 example characteristics "(b)," step 908 is configured to generate a TC producing a counterclockwise rotation such that the region 1002 will be above the minimum frequency of one percent below nominal. Such calculation may utilize a simulation model of the circuitry implementing the subject oscillator according to the second embodiment. The value of TC is then stored in memory. It will be understood that step 908 may also determine that the characteristic is such that no TC can achieve the necessary rotation.

Referring still to Referring to FIGS. 9 and 10, in another example execution of step 908 on, for example, the FIG. 10 example characteristics "(d)" a clockwise rotation, and corresponding value of TC is calculated such that the region 1004 will be above the minimum frequency of one percent below nominal. The value of TC is then stored in memory.

Referring to FIG. 9, at step 910, a determination is made of the optimum temperature for rotating the frequency versus temperature characteristic by the amount calculated at step 908. The identified temperature may, for example, be normal room temperature. A corresponding value for TempSet described above is then stored in memory.

FIG. 11 illustrates, in a representative graphical form, example kinds of benefits of oscillator frequency with respect to temperature characteristics, predicted by one simulation model to be obtainable from aspects of one example according to a second embodiment. The FIG. 11 illustration shows the effects, as predicted by a simulation model, of an oscillator according to the second embodiment such as, for example, the FIG. 5 example 400, operating with TC values based on the frequency versus temperature characteristics depicted at FIG. 10. Referring to FIG. 11, for each of the characteristics "(a)" through "(d)," the dotted line represents the rotated characteristic.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention.

Accordingly, the foregoing disclosure, description, and figures are for illustrative purposes only and do not in any way limit the invention, which is defined only by the claims.

We hereby claim:

1. An oscillator, comprising
a voltage reference unit to generate a reference voltage;
an oscillator control current unit to generate an oscillator reference current based, at least in part, on the reference voltage, the oscillator control current unit further comprising:

a temperature sensor that detects a temperature of the oscillator and generates a temperature signal; and means for adjusting the oscillator reference current based on the temperature signal and given temperature compensation data; and a toggling oscillator to generate an oscillating output signal at an oscillating frequency based, at least in part, on the reference voltage and the oscillator reference current.

2. The oscillator of claim 1, further comprising:

a storage unit to store a plurality of the given temperature compensation data, retrievable based on said temperature signal, wherein the oscillator control current unit further comprises:

a base reference current generator to generate a base reference current based, at least in part, on the reference voltage, and a reference current generator to generate the oscillation reference current based, at least in part, on retrieved temperature compensation data and on the base reference current.

3. The oscillator of claim 1, further comprising:

a frequency trim storage to store and output a frequency trim value, wherein the oscillator control current unit further comprises:

a base reference current generator to generate a base reference current based, at least in part, on the reference voltage, and a reference current generator to generate the oscillation reference current based, at least in part, on the frequency trim value and the base reference current.

4. The oscillator of claim 2, further comprising:

a frequency trim storage to store and output a frequency trim value, wherein the reference current generator generates the oscillation reference current based, at least in part, on the frequency trim value, the retrieved temperature compensation data and the base reference current.

5. The oscillator of claim 1, further comprising:

a storage unit to store a plurality of the given temperature compensation data, retrievable based on said temperature signal; and a frequency trim storage to store and output a frequency trim value, wherein the oscillator control current unit further comprises:

a comparator for comparing the temperature signal to a given optimal rotation temperature, and to generate a rotation control signal based on said comparing;

a temperature-based compensation current generator to generate a positive coefficient temperature-based current and a negative coefficient temperature-based current;

a temperature compensation current generator to generate a temperature compensation current based on selecting one of the positive coefficient temperature-based current and the negative coefficient temperature-based current, the selecting based on the rotation control signal, and on weighting the selected one by the retrieved temperature compensation data;

a temperature compensated oscillator current generator to generate a temperature compensated oscillator current based on the temperature compensation current added to, or subtracted from, the base reference current, wherein the reference current generator selects between adding and subtracting based on the rotation control signal; and a frequency compensated oscillator current generator to generate the oscillator reference current based on the temperature compensated oscillator current and the frequency trim value.

6. The oscillator of claim 1, wherein the given temperature compensation data include rotation temperature data and rotation weight data, and wherein said means for adjusting the oscillator current based on the temperature signal and a given temperature compensation data further comprises:

means for selecting, based on a comparison of the temperature signal and the rotation temperature data, one from increasing and decreasing the oscillator reference current by an amount based on a selected weighted temperature compensation current.

7. The oscillator claim 1, wherein the given temperature compensation data include rotation temperature data and rotation weight data, and wherein said means for adjusting the oscillator current based on the temperature signal and a given temperature compensation data further comprises:

means for generating a plurality of temperature compensation currents based on the temperature of the oscillator, each of said plurality based on a corresponding one of a plurality of coefficients of current versus temperature;

means for weighting the temperature compensation currents based on the rotation weight data, to generate a plurality of weighted temperature compensation currents;

means for selecting from the plurality of weighted temperature compensation currents based on a comparison of the temperature signal and the rotation temperature data; and means for selecting, based on a comparison of the temperature signal and the rotation temperature data, one from increasing and decreasing the oscillator reference current by an amount based on the selected weighted temperature compensation current.

8. The oscillator of claim 1, wherein the oscillator control current unit further comprises:

means for generating a positive temperature coefficient compensation current and a negative temperature coefficient compensation current;

means for weighting the positive temperature coefficient compensation current and the negative temperature coefficient compensation current based on a stored rotation value;

means for generating a temperature compensated base reference current by selectively adding or subtracting one of the weighted positive temperature coefficient compensation current and the weighted negative temperature coefficient compensation current from the base reference signal, wherein the selection between adding and subtracting is based on a comparative value of the temperature signal and a given rotation temperature; and means for generating the oscillator reference current based on the temperature compensated base reference current.

9. An oscillator comprising:

means for generating a reference voltage;

means for generating a reference current based, at least in part, on said reference voltage, wherein said means for generating a reference current further comprises;

means for generating a base reference signal based on said reference voltage, and means for generating said reference current based on said base reference current, given temperature compensation weight data, said temperature signal, and given rotation temperature data;

means for generating an oscillating signal at a frequency based on said reference current and said reference voltage; and means for detecting a temperature of said oscillator and generating a corresponding temperature signal.

10. The oscillator of claim 9, further comprising:

means for detecting a temperature of said oscillator and generating a corresponding temperature signal, wherein said means for generating a reference current further comprises:

means for generating a base reference signal based on said reference voltage, and means for generating said reference current based on said base reference current, given temperature compensation weight data, said temperature signal, given rotation temperature data, and given frequency trim data.

11. The oscillator of claim 1, wherein said toggling oscillator further comprises:

a capacitor;

a comparator to compare a voltage of the capacitor to the reference voltage and to output a corresponding comparison signal;

a toggle flip flop clocked between a first state and second state by said comparison signal, and having a flip flop output and a complementary flip flop output representing said first state and said second state; and a switching circuit switchable between said first state and said second state based on at least one of said flip flop output and said complementary flip flop output, said first state charging said capacitor based on said oscillator reference current, and said second state discharging said capacitor.

12. The oscillator of claim 1, wherein said oscillator control current unit generates said oscillator reference current to include a first oscillator reference current and a second oscillator reference current, and wherein said toggling oscillator further comprises:

a first capacitor;

a second capacitor;

a first comparator to compare a voltage of the first capacitor to the reference voltage and to output a corresponding first comparison signal;

a second comparator to compare a voltage of the second capacitor to the reference voltage and to output a corresponding second comparison signal;

a toggle flip flop clocked to a first state by the first comparison signal and clocked to a second state by the second comparison signal, and having a flip flop output and a complementary flip flop output representing said first state and said second state;

a first switching circuit switchable between said first state and said second state based on at least one of said flip flop output and said complementary flip flop output, said first state charging said first capacitor based on said first oscillator reference current, and said second state discharging said first capacitor; and a second switching circuit switchable between said first state and said second state based on at least one of said flip flop output and said complementary flip flop output, said first state charging said second capacitor based on said second oscillator reference current, and said second state discharging said second capacitor.

13. A method for generating a clock signal, comprising:

generating a reference voltage;

generating a reference current based on said reference voltage;

generating the oscillating clock signal based on said reference voltage and said reference current;

detecting a temperature associated with at least one of the steps of generating a reference voltage and generating a reference current, and generating a corresponding temperature signal; and adjusting said reference current based on said reference voltage, said temperature signal and given temperature compensation data, wherein the given temperature compensation data includes rotation temperature data and rotation weight data, and wherein said adjusting the oscillator current based on the temperature signal and the given temperature compensation data further comprises:

selecting, based on a comparison of the temperature signal and the rotation temperature, one from increasing and decreasing the oscillator reference current by an amount based on the selected weighted temperature compensation current.

14. The method of claim 13, wherein said adjusting the oscillator current based on the temperature signal and a given temperature compensation data further comprises:

generating a plurality of temperature compensation currents based on a temperature of the oscillator, each of said plurality of temperature compensation currents based on a corresponding one of a plurality of coefficients of current versus temperature;

weighting the temperature compensation currents based on the rotation weight data, to generate a plurality of weighted temperature compensation currents; and selecting from the plurality of weighted temperature compensation currents based on a comparison of the temperature signal and the rotation temperature data.

15. The method of claim 13, further comprising:

fabricating a plurality of oscillator circuits having a voltage reference unit to generate a reference voltage, an oscillator control current unit to generate an oscillator reference current based, at least in part, on the reference voltage, and a toggling oscillator to generate an oscillating output signal at an oscillating frequency based, at least in part, on the reference voltage and the oscillator reference current;

testing a plurality of said oscillator circuits to obtain sample data representing an oscillating frequency versus temperature characteristic over a given temperature range; and calculating said rotation temperature data and said rotation weight data based on said sample data and a given oscillating frequency versus temperature characteristic.

* * * * *